United States Patent
Gaynes et al.

(10) Patent No.: US 6,495,771 B2
(45) Date of Patent: Dec. 17, 2002

(54) COMPLIANT MULTI-LAYERED CIRCUIT BOARD FOR PBGA APPLICATIONS

(75) Inventors: Michael Anthony Gaynes, Vestal, NY (US); Eric Arthur Johnson, Greene, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/820,563

(22) Filed: Mar. 29, 2001

(65) Prior Publication Data
US 2002/0139570 A1 Oct. 3, 2002

(51) Int. Cl.[7] .................................................. H05K 1/03
(52) U.S. Cl. ........................ 174/255; 174/256; 29/830
(58) Field of Search ............................... 174/255, 256, 174/257; 29/830; 257/758, 686, 778; 439/66

(56) References Cited

U.S. PATENT DOCUMENTS

| | | | |
|---|---|---|---|
| 4,692,843 A | 9/1987 | Matsumoto et al. | |
| 5,041,183 A | 8/1991 | Nakamura et al. | |
| 5,221,417 A | 6/1993 | Basavanhally | |
| 5,388,328 A | * 2/1995 | Yokono et al. | ................ 29/830 |
| 5,478,700 A | 12/1995 | Gaynes et al. | |
| 5,672,400 A | 9/1997 | Hansen et al. | |
| 5,982,471 A | * 11/1999 | Hirakata et al. | ............ 349/155 |
| 6,316,786 B1 | * 11/2001 | Mueller et al. | ............. 257/686 |
| 6,329,717 B1 | * 12/2001 | Jang et al. | .................. 257/758 |

* cited by examiner

Primary Examiner—Albert W. Paladini
(74) Attorney, Agent, or Firm—Scully, Scott, Murphy & Presser; Lawrence A. Fraley

(57) ABSTRACT

A electronic package is constituted of a compliant multi-layered circuit board or printed circuit board package, particularly for use in ball grid array (BGA) applications wherein two or possibly greater numbers of naturally spaced sub-composites are equipped with electronic circuitry which is interconnected through the intermediary of conductive adhesives. Pursuant to a method of producing, no other mechanical connection is provided intermediate these spaced sub-composites except, possibly, along the periphery of the structure thereof, where a molded plastic seal may be provided in order to form a protection against the ingress environmental or external influences. The unfilled void, space or interspatial volume which is present between the spaced sub-composite facilitates the deformation in shear of the conductive adhesive interconnections, such as epoxy resins or the like, with extremely little constraint of the various components.

Figure 1:
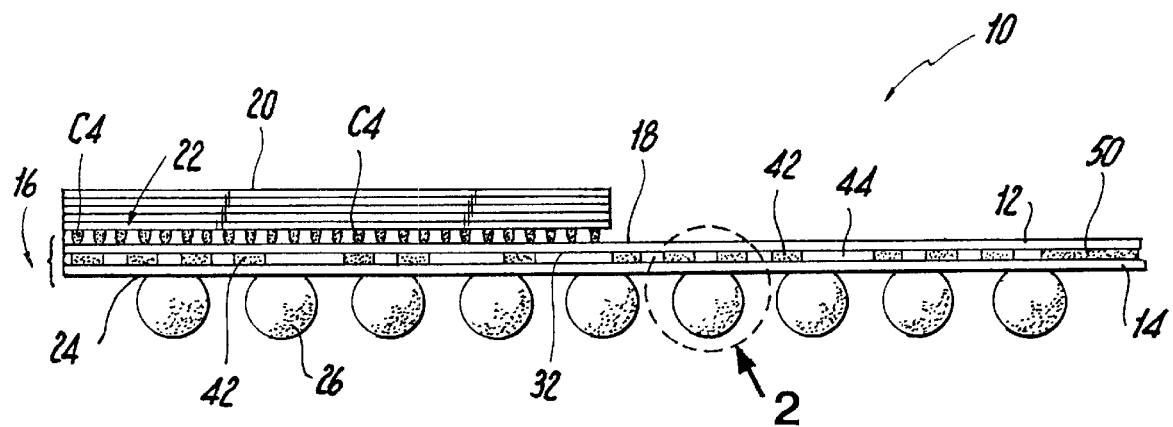

40 Claims, 1 Drawing Sheet

COMPLIANT MULTI-LAYERED CIRCUIT BOARD FOR PBGA APPLICATIONS

BACKGROUND OF THE INVENTION

1. Field of the Invention

The present invention relates to electronic packages consisting of compliant multi-layered circuit boards or printed circuit cards for plastic ball grid array (PBGA) applications, and in particular, may relate to different types of ball grid array packages which are designed to reduce the effects of differential thermal expansions to which PBGA packages are subjected. Moreover, the invention is also adapted to provide a method of manufacturing such types of compliant multi-layered circuit boards or printed circuit cards of this type.

In the technology, electronic packages, such as PBGA packages or TBGA (tape ball grid array) packages are presently utilized in order to form reliable interconnections between semiconductor chips which are supported on printed circuit cards or boards. Generally, the flexibility of the tape of the tape ball grid array renders it possible to accommodate large differences in thermal strains which are encountered between a semiconductor chip ordinarily possessing a coefficient of thermal expansion (CTE) of approximately 3 ppm/°C., and a printed circuit card, normally possessing a typical CTE of approximately 17 ppm/°C. Nevertheless, this accommodation is only possible with a depopulated ball grid array (BGA), inasmuch as provision must be made for a free or open area between the edge of the semiconductor chip and the innermost row of balls, which can be easily deformed in order to be able to absorb the thermally-induced strain. As a result, the number of inputs and outputs (I/O's) which can be provided in such an electronic package are essentially limited in quantity.

Basically, PBGA electronic packages each possess multiple dielectric layers and are relatively thick and rigid in their overall and assembled construction. Consequently, any bending of the package which is encountered due to the rigid nature of the coupling or interconnections between the essentially laminated substrate or circuitized carrier and semiconductor chip results in a premature failure of the BGA interconnections. Moreover, the constraint of the carrier or substrate by the semiconductor chip also reduces its effective coefficient of thermal expansion (CTE), thereby resulting in the formation of a shear strain in the BGA and consequent early fatigue of the electronic package, leading up to its failure. Additionally, the differential expansion between the semiconductor chip and the circuitized carrier or substrate can also produce fatigue of any C4 interconnections (control collapse chip interconnections) which are present in flip-chip applications.

In view of the above-mentioned problems, PBGA packages have been proposed in the technology, which incorporate dielectric layers possessing a very low shear stiffness, and wherein examples of the materials which may be employed included such as PTFE (polytetrafluoroethylene) and silicone. However, both of these dielectric materials present technological processing challenges; and moreover, silicone is subject to a very high out-of-plane degree of expansion, which due to its high bulk modulus and the degree of constraint of the components, can also lead to premature failure of plated through-holes (PTH's) which are formed in the electronic package.

Heretofore, compliant layers have been proposed as a solution which is intended to reduce the effects of differential thermal expansion on C4 connect and BGA service life expectancy in PBGA electronic packages. Consequently, the intent has been to attain a reduction in the stiffness of a layer by reducing its modulus or, alternatively by using a material which deforms plastically under a low stress. PTH's and vias which have been formed in the electronic packages reduce this compliance to some degree and accordingly may also be subject to an early fatigue failure. The moduli and yield strengths of these materials are relatively low when compared with glass-epoxy prepreg or other materials which are employed for dielectric layers; for example, 70 MPa vs. 5 GPa.

Moreover, conductive epoxies have also been used for the purpose of connecting sub-composites or layers of a multi-layer electronic package; however, voids or open volumes or spaces have not been intentionally formed in the resultant assembly. A second, nonconductive adhesive has normally been employed as an insulator between the layers of the sub-composites, and wherein a continuous layer of material between the sub-composites is considered to be desirable in the technology inasmuch as a lamination process is carried out under a relatively high pressure.

Thus, in essence, the technology has addressed itself with only limited success at this time in overcoming the disadvantages and shortcomings encountered in the constructions of electronic packages of this type.

2. Discussion of the Prior Art

Hansen, et al. U.S. Pat. No. 5,672,400 discloses an electronic assembly with semi-crystalline copolymer adhesive wherein layers of first and second substrates are interconnected electrically through a semi-crystalline copolymer adhesive composition, such as in the form of a film. The interconnecting film completely fills out the interspace between the two surfaces of the substrates layers carrying the electronic circuits and is deemed to be subject to the disadvantages described hereinabove with regard to early failure of the BGA electronic package due to encountered bending strains and stresses.

Gaynes, et al. U.S. Pat. No. 5,478,700 discloses a method of applying bonding agents to a pad and/or interconnection sites in the manufacture of electrical circuits using a bonding agent injection head. Although this particular structure is generally quite satisfactory in use, it does not specifically address itself to a construction and method of producing electronic packages constituted of compliant multi-layer circuit boards or printed cards for PBGA applications in the unique a manner as disclosed by the present invention.

Basavanhally, U.S. Pat. No. 5,221,417 discloses a conductive adhesive film manufacturing technique for multilayered electronic packages, wherein a film completely fills the interspace between first and second conductor arrays located on the facing surfaces of separate spaced substrate structures of the electronic package.

Nakamura, et al. U.S. Pat. No. 5,041,183 discloses a method for the preparation of a hot-melt adhesive interconnector utilized in electronic packages, wherein a type of film containing conductive adhesive spots is positioned intermediate separate substrate layers so as to completely fill the interspaces thereof.

Finally, Matsumoto, et al. U.S. Pat. No. 4,692,843 discloses a multi-layered printed wiring board wherein spaces are provided in order to separate discrete layers of a substrate. This type of circuit board structure is relatively complex, and moreover does not address itself to the problems solved by the present invention in the provision of a compliant multi-layered circuit board for PBGA utilization.

SUMMARY OF THE INVENTION

Accordingly, pursuant to the present invention, there is provided an electronic package constituted of a compliant multi-layered circuit board or printed circuit board package, particularly for use in ball grid array (BGA) applications wherein two or possibly greater numbers of naturally spaced sub-composites are equipped with electronic circuitry which is interconnected through the intermediary of conductive adhesives. No other mechanical connection is provided intermediate these spaced sub-composites except, possibly, along the periphery of the structure thereof, where a molded plastic seal may be provided in order to form a protection against the ingress environmental or external influences. Basically, an important aspect of the present invention resides in that the unfilled void, space or interspatial volume which is present between the spaced sub-composite facilitates the deformation in shear of the conductive adhesive interconnections, such as epoxy resins or the like, with extremely little constraint of the various components.

Through the presence of unfilled spaces being provide between or among the spaced, layers of the sub-composites of the electronic package, the shear stiffness which is encountered can be materially reduced. For example, 200 micron diameter epoxy interconnections at a pitch of 350 microns spaced between the layers of the sub-composites would reduce shear stiffness by approximately 75%, as elucidated in further detail hereinbelow.

Accordingly, it is a primary object of the invention to provide a compliant multi-layered circuit board or printed circuit card which incorporates at least two spaced sub-composites or circuitized substrates incorporating unfilled interspaces therebetween so as to enable shear deformation of the electrical interconnections thereof under only very limited conditions of constraint.

Another object of the present invention is to provide a compliant multi-layer electronic package of the type described with interconnections adapted for PBGA applications, to which there is imparted an enhanced flexibility through the intermediary of spaced sub-composites of the electronic package providing for unfilled interspaces between the individual composite layers mounting the electronic circuitry.

Another object of the present invention is to provide a method of forming compliant multi-layered circuit boards or printed circuit cards of the type described herein, which enhances the service life of the electronic package by reducing the shear stiffness thereof through a novel multi-layered spaced construction of increased flexibility.

BRIEF DESCRIPTION OF THE ACCOMPANYING DRAWINGS

Figure 2:
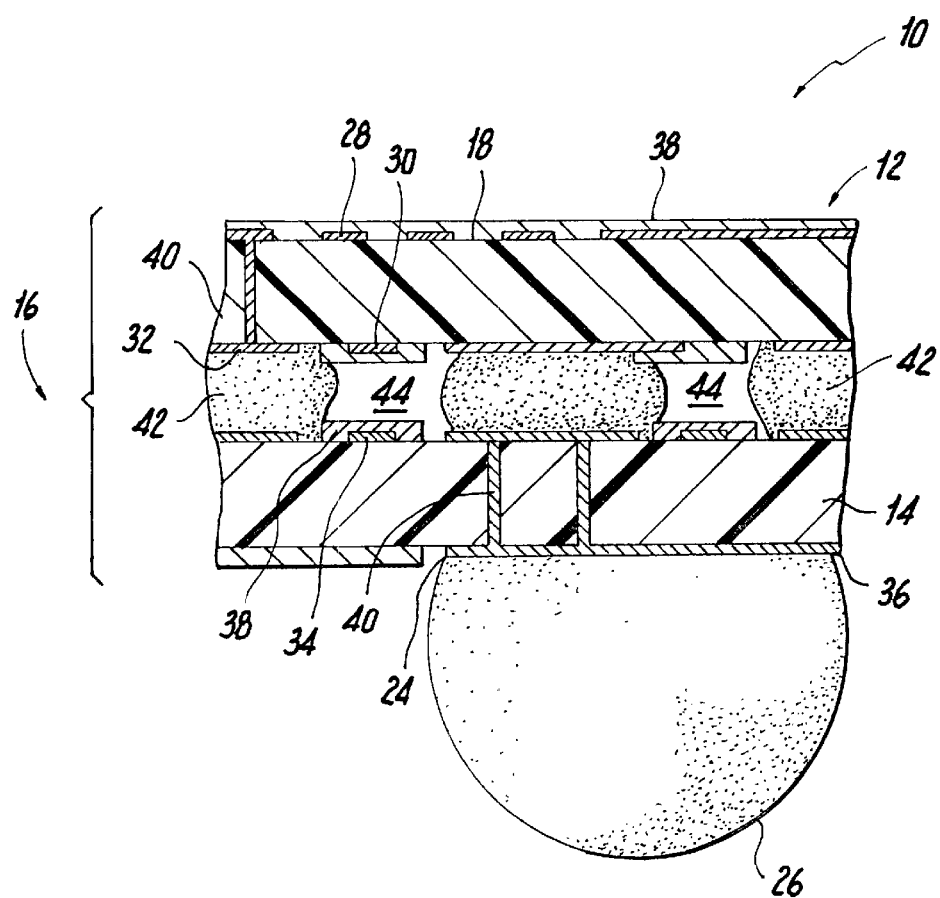

Reference may now be made to the detailed description of a preferred embodiment of the compliant or multi-layered circuit board pursuant to the invention, taken in conjunction with the accompanying drawings; which:

FIG. 1 illustrates a partial side view of an electronic package having a compliant multi-layered structure of spaced sub-composites pursuant to the invention; and FIG. 2 illustrates, on an enlarged scale, a fragmentary detail of the electronic package of FIG. 1, as shown in the encircled portion A of FIG. 1.

DETAILED DESCRIPTION OF A PREFERRED EMBODIMENT

Referring in particular to FIG. 1 of the drawings, there is illustrated a segment of a compliant multi-layered printed circuit board 10 which includes a first core of a substrate sub-composite layer 12 which is positioned in parallel spaced relationship with a second core of a substrate sub-composite layer 14 comprising in combination a composite circuitized multi-layer 16 of an electronic package, so as to provide an open interspace between layers 12 and 14.

Mounted on an outer surface 18 of the substrate sub-composite 12 of the compliant multi-layer circuitized carrier is a semiconductor chip 20 having C4 (controlled collapse chip connect) connections 22 facing the surface 18 of the substrate sub-composite layer 12. The outer surface 24 of the second substrate sub-composite layer 14 is provided with solder balls 26, in a manner as is well known in the technology.

As illustrated in the enlarged fragmentary view of FIG. 2 of the drawings, representing detail A of FIG. 1, the upper sub-composite or core 12 is equipped with signal traces 28 and power traces 30 on the respective opposite surfaces 18 and 32 thereof, whereas the lower sub-composite core or layer 14 may also be equipped with signal and power traces 34,36 wherein solder masking 38 is deposited on the surfaces thereof. Vias 40 in the form of either conductive paste-filled or plated through-holes (PTH) may be provided in each of the sub-composite layers or cores 12,14 and are adapted to form interlayer electrical connections, as is well known in this technology. A conductive adhesive 42 maybe spot-screened onto the facing surfaces of the spaced sub-composites 12,14 prior to lamination so as to permit the presence of open or free interspaces 44 across the area present therebetween.

Furthermore, a continuous seal 50, as shown in FIG. 1, maybe provided around the periphery between the sub-composites 12,14 so as to facilitate handling of the multi-layers circuit board and to protect the interior between the sub-composites from influences of the environment after singulation of the electronic packages.

The seal 50 providing the peripheral continuous sealing effect between layers 12,14, may consist of a second adhesive material different from adhesive 42, such as, for example, a silicone which is not conductive, or it may constitute a large-sized interconnection for either power or ground. Furthermore, there may be instances in which areas of the sub-composites require no interconnection between the layers thereof. During lamination, this may result in deformation of the sub-composites 12,14 and thinning of any interconnections adjacent to those areas. However, in the_ manufacture thereof, a non-conductive epoxy may be employed in order to provide support in these areas intermediate the locations of the conductive adhesive 42, provided the total amount or percentage of such area covered is relatively small and facilitates the provision of a maximum amount of open or unfilled space intermediate the sub-composites 12,14. Alternatively, rather than a non-conductive epoxy, as the adhesive 42, there may be utilized glass beads (not shown) in lieu thereof in order to separate the sub-composites 12,14 and permanently maintain the spacing therebetween.

It is generally of importance to be able to utilize a material which is adapted to be subjected to thousands of cycles at strains of up to 2%. Ordinarily solder joints are unlikely to survive such high strains. Conductive epoxies have been proven to reliably withstand these types of loads of a cycling nature.

It is also necessary, on the basis of the interposition of the glass beads as the spacers during lamination, that this maintains sufficient height for the adhesive interconnections inasmuch as for a given displacement or deformation, the shear strain increases as the height in the spacing provided between the sub-composites 12,14 is diminished. Consequently the lamination must be generally implemented at lower pressures than a currently employed in the technology of such multi-layered structures in which there are no open interspaces provided.

During the preparation of the inventive compliant multi-layered electronic package, it is important that the circuit pads are clean, and several choices of cleaning treatments, such a good water wash, plasma, etch and applied silane adhesion promoter may be readily utilized.

Furthermore, the preferred pad metallurgy utilized in these compliant multi-layer structures is soft gold plated over nickel. However, palladium, palladium-nickel or silver/silver alloys would also be preferable, some that are less desirable are bare copper, nickel, aluminum or tin. A transient liquid connection intermediate the eca (electrical circuit areas) and the pad metallurgy can also be implemented, wherein silver or gold flake in the eca will TLP bond with tin, lead (>220° C.) or indium (<150° C.) bonding temperatures. The eca can be deposited by conventional stencil techniques similar to solder paste screenings and wherein, as illustrated in FIG. 1 of the drawings, 0.2 mm diameter adhesive interconnections can be employed, enabling 3,000 interconnections between cores or sub-composites 12,14 on a 20 by 20 mm substrate area. This type of formulation can be implemented easily for thermoset materials, in which the eca would have to be B-staged, and this can be typically done at between an 80–100° C. temperature range within 10–30 minutes, depending upon the selected adhesive.

It also is possible to use thermoplastics which can be conveniently applied, as described in U.S. Pat. No. 5,759,737, utilizing an enclosed extrusion head as described, for example, in U.S. Pat. Nos. 5,478,700 and 5,565,033, this process being essentially referred to as "photobumping" inasmuch it is utilized to define eca bumps on wafers at 0.2 mm diameter, 0.5mm pitch, whereby photoresist is applied to the surface, in which apertures are photolithographically defined and an extrusion squeegee head traverses the surface filling the apertures. The solvent is removed for thermoplastics by baking at typically 70° C. for a period of about 30 minutes, and due to a volume shortage, a second pass may be implemented refilling the apertures, baking and finally stripping the photoresist.

While the invention has been particularly shown and described with respect to preferred embodiments thereof, it will be understood by those skilled in the art that the foregoing and other changes in form and details may be made therein without departing form the spirit and scope of the invention.

What is claimed is:

1. A multi-layered electronic package, comprising:
   a first substrate comprising a dielectric material;
   at least one further substrate comprising a dielectric material being spaced from said first substrate; electrically conductive layers being arranged on at least the mutually facing spaced surface of said first and at least one further substrates;
   and discrete spacer structures each constituted of an electrically conductive adhesive extending between said substrates, said electrically conductive layers being mechanically and electrically interconnected by said discrete spacer structures while maintaining an open spacing between said first and at least one further substrate.

2. A multi-layered electronic package as claimed in claim 1, wherein non-conductive rigid spacer elements are interposed between said substrates so as to assist in maintaining the spacing therebetween in regions devoid of said electrically conductive interconnecting spacer structures.

3. A multi-layered electronic package as claimed in claim 2, wherein said non-conductive rigid spacer elements comprise a non-conductive epoxy or glass beads.

4. A multi-layered electronic package as claimed in claim 1, wherein said substrates are each of a substantially planar configuration arranged in parallel spaced relationship with each other.

5. A multi-layered electronic package as claimed in claim 4, wherein said substrates are constituted of organic laminates imparting compliant properties thereto.

6. A multi-layered electronic package as claimed in claim 1, wherein said substrates each have electrically conductive vias formed therein, and electrical circuitry being screened onto respective opposite surfaces of each of said substrates forming electrical interconnections with said vias.

7. A multi-layered electronic package as claimed in claim 6, wherein said electrical circuitry comprises signal traces or power traces formed on respective opposite surfaces of said substrates.

8. A multi-layered electronic package as claimed in claim 6, wherein said vias comprise plated through-holes (PTH).

9. A multi-layered electronic package as claimed in claim 1, wherein a semiconductor chip package is mounted in operative connection on an outer surface of said first substrate, and a ball grid array (BGA) is provided on an outer surface of said at least one further substrate.

10. A multi-layered electronic package as claimed in claim 1, wherein said electrically conductive adhesive comprises a thermoset adhesive material.

11. A multi-layered electronic package as claimed in claim 1, wherein said electrically conductive adhesive comprises a thermoplastic adhesive material.

12. A multi-layered electronic package as claimed in claim 1, wherein said adhesive includes electrically conductive particles selected from the group of materials consisting of gold, Pd, Pd Ni and silver.

13. A multi-layered electronic package as claimed in claim 4, wherein said spaced substrates form a structure having a combined overall thickness of about 0.3 mm, said adhesive interconnections each having a diameter of about 0.2 mm facilitating the forming of over 3000 interconnections between said substrates over a 20 mm×20 mm substrate surface area.

14. A multi-layered electronic package as claimed in claim 1, wherein a seal extends intermediate said first and said at least one further substrate along the peripheral edges thereof so as to sealing encompass said open space between said substrates.

15. A multi-layered electronic package as claimed in claim 14, wherein said seal forms a sealed cavity protective of the space between said substrates from environmental influences tending to adversely affect the integrity of said package.

16. A multi-layered electronic package as claimed in claim 14, wherein said seal is constituted of a non-conductive adhesive material.

17. A multi-layered electronic package as claimed in claim 16, wherein said non-conductive adhesive material consists of silicone.

18. A multi-layered electronic package as claimed in claim 14, wherein said seal comprises an electrical interconnection for power or ground.

19. A multi-layered electronic package as claimed in claim 1, wherein said package comprises a multi-layered compliant circuit board.

20. A multi-layered electronic package as claimed in claim 1, wherein said package comprises a multi-layered printed circuit card.

21. A method of producing a multi-layered electronic package, said method comprising:

provided a first substrate comprising a dielectric material;

at least one further substrate comprising a dielectric material spaced from said first substrate;

forming electrically conductive layers on at least the mutually facing spaced surfaces of said first and at least one further substrates;

and providing discrete spacer structures each constituted of an electrically conductive adhesive so as to extend between said substrates and mechanically and electrically interconnecting said electrically conductive layers while maintaining an open spacing between said first and at least one further substrate.

22. A method of producing a multi-layered electronic package as claimed in claim 21, wherein non-conductive rigid spacer elements are interposed between said substrates so as to assist in maintaining the spacing therebetween in regions devoid of said electrically conductive interconnecting spacer structures.

23. A method of producing a multi-layered electronic package as claimed in claim 22, wherein said non-conductive rigid spacer elements comprise a non-conductive epoxy or glass beads.

24. A method of producing a multi-layered electronic package as claimed in claim 21, wherein said substrates are each of a substantially planar configuration arranged in parallel spaced relationship with each other.

25. A method of producing a multi-layered electronic package as claimed in claim 24, wherein said substrates are constituted of organic laminates imparting compliant properties thereto.

26. A method of producing a multi-layered electronic package as claimed in claim 24, wherein said spaced substrates form a structure having a combined overall thickness of about 0.3 mm, said adhesive interconnections each having a diameter of about 0.2 mm facilitating the forming of over 3000 interconnections between said substrates over a 20 mm×20 mm substrate surface area.

27. A method of producing a multi-layered electronic package as claimed in claim 21, wherein said substrates each have electrically conductive vias formed therein, and electrical circuitry are screened onto respective opposite surfaces of each of said substrates so as to form electrical interconnections with said vias.

28. A method of producing a multi-layered electronic package as claimed in claim 27, wherein said electrical circuitry comprises signal traces or power traces formed on respective opposite surfaces of said substrates.

29. A method of providing a multi-layered electronic package as claimed in claim 27, wherein said vias comprise plated through-holes (PTH).

30. A method of producing a multi-layered electronic package as claimed in claim 21, wherein a semiconductor chip package is mounted in operative connection on an outer surface of said first substrate, and a ball grid array (BGA) is provided on an outer surface of said at least one further substrate.

31. A method of producing a multi-layered electronic package as claimed in claim 21, wherein said electrically conductive adhesive comprises a thermoset adhesive material.

32. A method of producing a multi-layered electronic package as claimed in claim 21, wherein said electrically conductive adhesive comprises a thermoplastic adhesive material.

33. A method of producing a multi-layered electronic package as claimed in claim 21, wherein said adhesive includes electrically conductive particles selected from the group of materials consisting of gold, Pd, Pd Ni and silver.

34. A method of producing a multi-layered electronic package as claimed in claim 21, wherein a seal extends intermediate said first and said at least one further substrate along the peripheral edges thereof so as to sealing encompass said open space between said substrates.

35. A method of producing a multi-layered electronic package as claimed in claim 34, wherein said seal forms a sealed cavity protective of the space between said substrates from environmental influences tending to adversely affect the integrity of said package.

36. A method of producing a multi-layered electronic package as claimed in claim 34, wherein said seal is constituted of a non-conductive adhesive material.

37. A method of producing a multi-layered electronic package as claimed in claim 36, wherein said non-conductive adhesive material consists of silicone.

38. A method of producing a multi-layered electronic package as claimed in claim 34, wherein said seal comprises an electrical interconnection for power or ground.

39. A method of producing a multi-layered electronic package as claimed in claim 21, wherein said package comprises a multi-layered compliant circuit board.

40. A method of producing a multi-layered electronic package as claimed in claim 21, wherein said package comprises a multi-layered printed circuit card.

* * * * *